United States Patent [19]

Hammerly

[11] Patent Number: 5,086,277
[45] Date of Patent: Feb. 4, 1992

[54] APPARATUS AND METHOD FOR PERFORMING DIAGNOSTIC TESTS ON THE ELECTRICAL SYSTEMS OF RECREATIONAL VEHICLES AND THE LIKE

[76] Inventor: Robert C. Hammerly, 6365 Copper Hill Dr. Prescott Valley, Ark. 86314

[21] Appl. No.: 493,788

[22] Filed: Mar. 15, 1990

[51] Int. Cl.$^5$ ............................................. G01R 31/00
[52] U.S. Cl. ........................... 324/504; 324/66; 340/431
[58] Field of Search .................. 324/504, 503, 500, 66; 340/431, 458

[56] References Cited

U.S. PATENT DOCUMENTS

| | | | |
|---|---|---|---|
| 3,103,808 | 9/1963 | Eichelberger | 324/504 X |
| 3,428,888 | 2/1969 | Nolte | 324/504 |
| 3,663,939 | 5/1972 | Olsson | 324/504 X |
| 4,866,390 | 9/1989 | Butchko | 324/504 |
| 4,878,025 | 10/1989 | Persson | 324/503 |
| 4,884,032 | 11/1989 | LaPensee | 324/504 |

Primary Examiner—Kenneth A. Wieder
Assistant Examiner—Robert W. Mueller
Attorney, Agent, or Firm—Cates & Holloway

[57] ABSTRACT

Testing apparatus is coupled to the plug used to connect the electrical system of a towed or trailer vehicle with a main or powered vehicle. The plug typically has terminals which connect related trailer vehicle electrical components with components in the main vehicle, e.g., the back up lights of the trailer vehicle are coupled to the back up lights (or transmission reverse gear) of the main vehicle. After coupling the testing apparatus to the plug portion attached to the trailer vehicle, switches can be used to activate selectively the trailer vehicle components. Instruments in the testing apparatus measure the electrical response to each activation and can be used to determine when the components are operating correctly. Similarly, when the portion of the plug coupled to the main vehicle is coupled to the testing apparatus, the response to activation of the main vehicle components can be monitored by the same instruments.

20 Claims, 2 Drawing Sheets

APPARATUS AND METHOD FOR PERFORMING DIAGNOSTIC TESTS ON THE ELECTRICAL SYSTEMS OF RECREATIONAL VEHICLES AND THE LIKE

BACKGROUND OF THE INVENTION

1. Field of the Invention

This invention relates generally to recreational and similar vehicles and, more particularly, to the diagnostic testing of electrical systems of trailer or towed vehicles.

2. Description of the Related Art

In the related art, the testing of the electrical system of a trailer or towed vehicle has typically been provided by electrically coupling the trailer vehicle to the main or powered vehicle, manipulating the components of the main vehicle, such as the brake pedal, and observing if the appropriate response, such as the illumination of an associated light, resulted from the activity. When the expected result was not achieved, an ohmmeter, for measuring electrical continuity, an ammeter for measuring current, or a volt meter for measuring electrical potential (the volt meter and ammeter typically requiring appropriate electrical power sources) was coupled to the circuit and selected measurements performed to isolate the cause of the failure.

The procedure in the prior art could become complicated. The initial detection of an operational failure in the electrical system did not localize the origin of the failure, i.e., between the main vehicle and the trailer vehicle. Therefore, additional testing to localize a detected malfunction in the electrical system can be required. Thereafter, the use of an ohmmeter, volt meter, and/or ammeter to determine the functionality of a selected electrical component requires electrical access to, and electrical isolation of, the selected component, a procedure that can require either background knowledge of, or access to, a vehicle manual. The testing of electrical components of trailer and main vehicles according to the prior art can require time consuming procedures.

A need has been felt for testing apparatus and an associated method that can test the electrical system of a trailer vehicle and can test portions of the main vehicle efficiently.

FEATURES OF THE INVENTION

It is an object of the present invention to perform diagnostic tests on recreational and similar vehicles.

It is a feature of the present invention to perform diagnostic tests on the electrical systems of recreational and similar vehicles.

It is a further feature of the present invention to provide apparatus and a related method for testing the electrical components of a trailer vehicle and a main vehicle.

It is yet another feature of the present invention to provide testing apparatus that can be coupled to the electrical outlet of a trailer vehicle and which can, in response to switch settings of the testing apparatus, determine the operational status of preselected electrical components.

It is still a further feature of the present invention to provide testing apparatus that can be coupled to the electrical outlet of a main (powered) vehicle and which can, in response to switch setting of the test apparatus, determine the operational status of preselected electrical components.

SUMMARY OF THE INVENTION

The aforementioned and other features are attained, according to the present invention, by coupling testing apparatus to the terminals of plugs electrically connecting a main vehicle and a trailer vehicle. Each plug terminal, once coupled to the testing apparatus, can be selectively activated and the response of the components coupled to each plug terminal can be identified and compared against expected values. The testing of selected electrical components in either the main (or powered) vehicle or the trailer vehicle can be performed by setting switches of the testing apparatus. The setting of the testing apparatus switches provides a predetermined activation of each plug terminal and, consequently, of the electrical component or components coupled to each plug terminal. Light emitting diodes, and an ammeter and a volt meter, coupled in the circuit containing the component activated by the switch, provide a visual indication of the result of the testing procedure. The testing apparatus also has coupling apparatus to engage the plug portion of the main vehicle, thereby permitting testing of electrical components in the main vehicle.

These and other features of the invention will be understood upon reading of the following description along with the drawings.

DESCRIPTION OF THE PREFERRED EMBODIMENT

1. Detailed Description of the Figures

Figure 1:
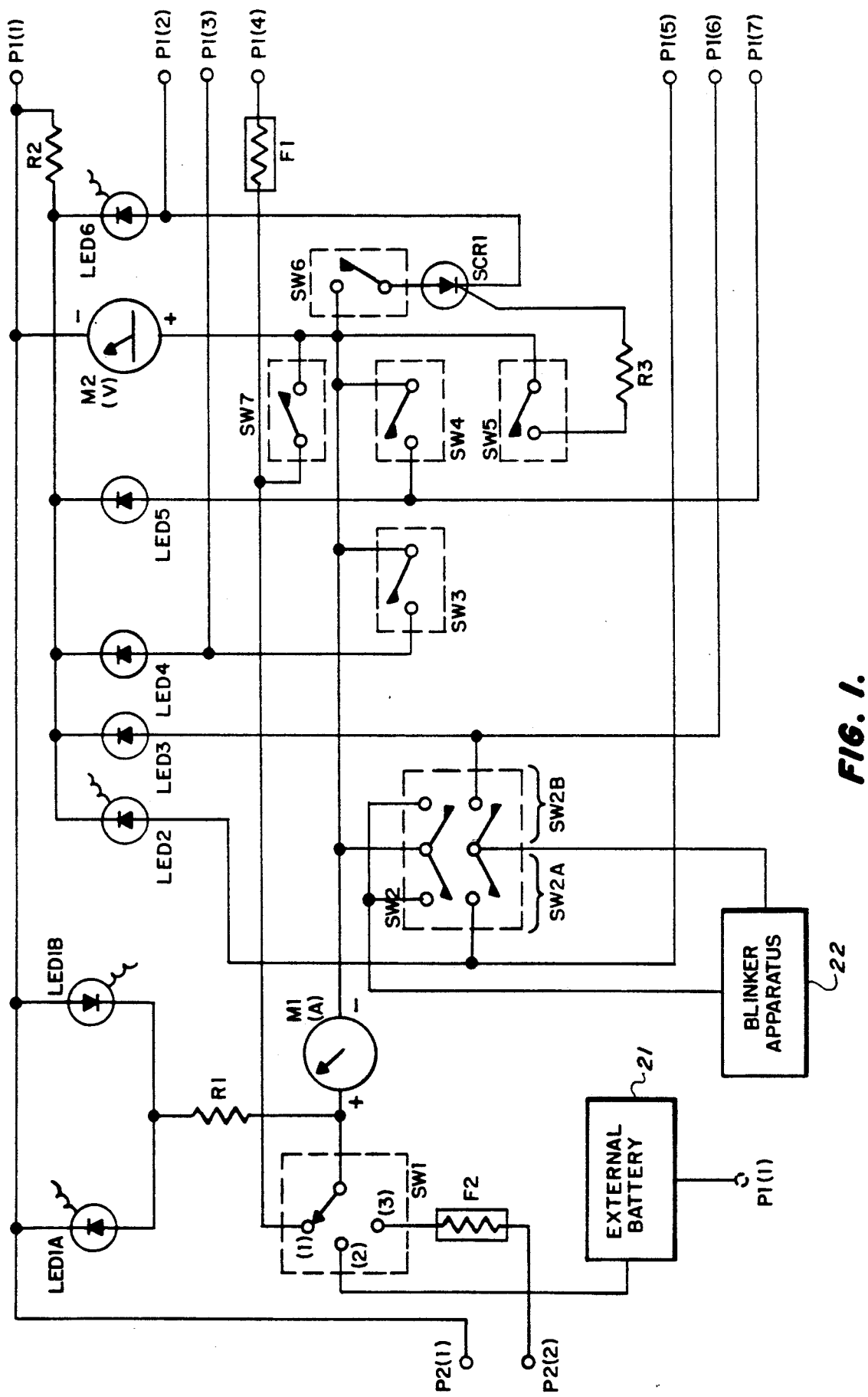
FIG. 1 is a schematic diagram of the electrical diagnostic apparatus according to the present invention.

Referring now to FIG. 1, the schematic circuit diagram of the apparatus for diagnostic testing of the electrical systems, according to the present invention, is shown. A first external battery terminal P2(1) is coupled to a cathode terminal of light emitting diode LED1A to an anode terminal of light emitting diode LED1B, to a negative terminal of voltmeter M2, to a first terminal of resistor R2, and to a plug terminal P1(1). A second terminal P2(2) is coupled through fuse F2 to a third terminal (3) of double pole double throw, center off, toggle switch SW1. A second terminal of switch SW1(2) is coupled to external battery 21, the terminal of opposite polarity of the external battery 21 being coupled to terminal P1(1), and a first terminal of switch SW1 is coupled to a trailer battery coupled to terminal P1(4). The common terminal of switch SW1 is coupled to a first terminal of resistor R1 and to the positive terminal of ammeter M1. The second terminal of resistor R1 is coupled to an anode terminal of light emitting diode LED1A and to a cathode terminal of light emitting diode LED1B. The negative output terminal of ammeter M1 is coupled to a first common terminal of double pole double throw, center off toggle switch SW2, to a common terminal of single pole single throw toggle switch SW3, to a common terminal of single pole single throw toggle switch SW4, to a common terminal of single pole single throw, momentary, normally open, push button switch SW5, to a terminal of single pole single throw, momentary, normally closed, push button switch SW6, to a terminal of single pole single throw, momentary normally open, push button switch SW7, and to the positive terminal of volt meter M2. The first set of output terminals of switch SW2 is coupled to a first terminal of a blinker apparatus 22. A second terminal of the blinker apparatus 22 is coupled to a second common terminal of switch SW2. A first terminal of a second set of terminals of switch SW2 is coupled to an anode terminal of light emitting diode LED2 and to output terminal P5. A second terminal of the second set of terminals is coupled to an anode terminal of light emitting diode LED3 and to output terminal P6. A terminal of switch SW3 is coupled to an anode terminal of light emitting diode LED4 and to output terminal P3. An output terminal of switch SW4 is coupled to an anode terminal to light emitting diode LED5 and to output terminal P7. A terminal of switch SW5 is coupled through resistor R3 to the control terminal of silicon control rectifier SCR1, while a common terminal of switch SW6 is coupled to a cathode of terminal silicon control rectifier SCR1. The anode terminal of silicon control rectifier is coupled to an anode terminal of light emitting diode LED6 and to output terminal P2. A third terminal of switch SW1 is coupled to a common terminal of switch SW7 and through fuse F1 to output terminal P4.

Figure 2:
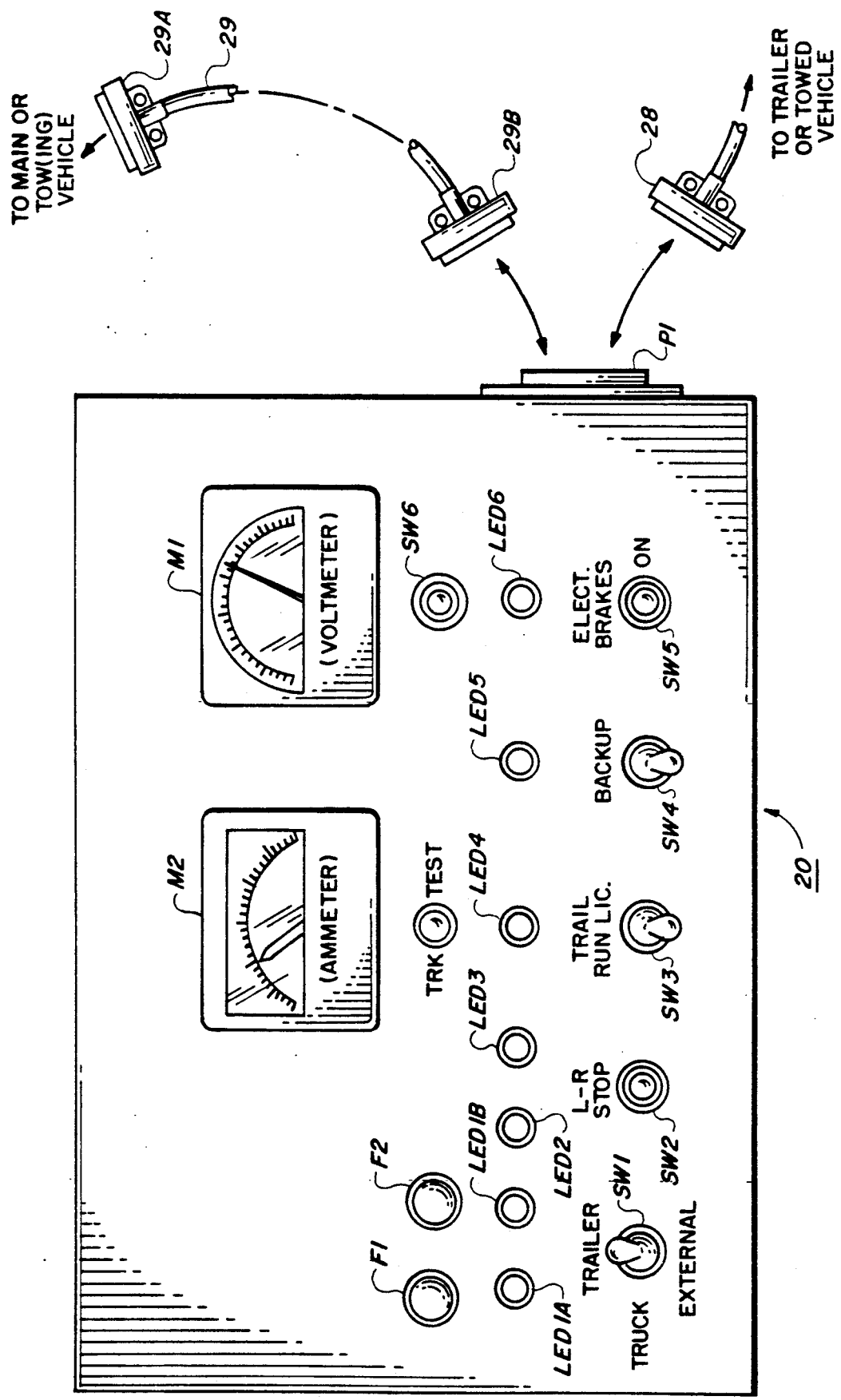
FIG. 2 is an illustration of the control panel of the testing apparatus according to the preferred embodiment.

Referring to FIG. 2, a front panel of one implementation of testing apparatus used in conjunction with the present invention is shown. The light emitting diodes and the switches are labelled consistently with the labels of FIG. 1. The related light emitting diodes and the switches are placed in physical proximity to descriptive identifying phrases on the panel to minimize errors in interpretation of an accompanying instruction manual. The receptacle P1 provides the mechanism for coupling the testing apparatus to the powered or main vehicle or, alternatively, to the trailer or towed vehicle. The receptacle P1 can be coupled to plug 28 from the trailer or towed vehicle, The receptacle can also be coupled to the towing vehicle by means of patch cord 29. In the patch cord, the connectors 29A and 29B have the same physical configuration as plug connector 28.

2. Operation of the Preferred Embodiment

The operation of the preferred embodiment can be understood as follows. The testing apparatus of the invention is coupled to the connector of a trailer or similar vehicle that is normally used to receive the cable from the powered vehicle providing the electrical coupling between the powered vehicle and the trailer vehicle. Referring to FIG. 1 and to FIG. 2, when the switch SW1 is in position (1), terminal P1(4) is coupled to one terminal of an internal battery of the trailer, while the opposite polarity terminal of the internal trailer battery is coupled to terminal P1(1). When the switch SW1 is in position (1) and the trailer has an internal battery, then the light emitting diode LED1A, which in the preferred embodiment emits a green radiation, will be illuminated unless the polarity of the internal battery is reversed. In the case of battery reversal, light emitting diode LED1B, which in the preferred embodiment emits a red radiation, will be illuminated. In addition, the volt meter M2 will display the voltage of the battery coupled between terminal P1(1) and terminal P1(4), i.e., 12.4 volts when fully charged.

When the trailer does not have an internal battery, an external battery can be coupled to the testing apparatus by placing SW1 in position (2). Similarly, the battery in the motor vehicle can be tested by placing SW1 in position (3).

The turn and stop lights of the trailer can be tested in the following manner. When the SW2A portion of switch SW2 is closed, the voltage applied between the common terminal of switch SW1 and the terminal P1(1) activates the terminal P1(5), which is coupled to the turn signal and stop light bulb on one side of the vehicle. To test the turn signal and the stop light bulb on the other side of the vehicle, the switch portion SW2B of switch SW2 is activated, the remaining stop and turn light bulbs being coupled to terminal P1(6). The light emitting diode associated with the bulb on the side of the vehicle being tested will be illuminated periodically (blink) and the ammeter M1 will read approximately 4 amperes. When the light emitting diode LED4 (associated with the tail light) is illuminated, the associated light bulb is not grounded or has a poor ground. When the light emitting diode associated with the side of the vehicle not being tested is illuminated periodically, then the wires (i.e., in the plug) are incorrectly connected.

In order to test the tail and clearance lights, switch SW3 is closed, activating terminal P1(3) to which the tail and clearance lights are coupled. In addition to the activation of the light emitting diode LED4, the presence of two tail lights will cause a 2 ampere reading on ammeter M1. Each clearance light draws ¼ ampere and the current drawn by the clearance light will be added to the current from the tail lights in the ammeter M1.

When switch SW4 is closed, the battery activates terminal P1(7), the terminal to which the back up light assembly is connected, and which has the battery coupled thereto. When the back light assembly is functioning properly, light emitting diode LED5 will be illuminated and the ammeter M1 will display a reading of 4 amperes.

The magnetic brakes of the trailer are coupled to the testing device between terminals P1(1) and terminal P1(2). When switch SW5 is activated for a brief period, the control grid of the silicon controlled rectifier SCR1 has voltage applied thereto, resulting in conduction through the rectifier element and the normally closed switch SW6. The conduction through the rectifier element applies power to terminal P1(2), thereby activating the magnetic brakes of the trailer. The magnetic brakes in the preferred embodiment draw 3 amperes each and the current through the ammeter should reflect the number of magnetic brakes and the operating parameters of the magnetic brakes. In order to check the magnetic brakes, a maximum time of 10 seconds is required to determine the required current. At the end of 10 seconds, switch SW6 is activated, opening the circuit momentarily and interrupting the current flow. The interrupted current will remain interrupted until voltage is reapplied to the control grid of the silicon controlled rectifier.

In order to test the operation of the main (or powered) vehicle components, the switch SW1 is placed in contact with the terminal (3), the truck terminal. The ignition key is turned to the on position (without engaging the starter). With proper operation of the electrical system, operation of the turn signal will cause the related LED2 or LED3 to be illuminated. When the transmission is placed in the reverse position (with the ignition key still in the on position), the light emitting diode LED5 will be illuminated indicating operation of the back-up lights. When the head light switch is placed in the intermediate position, light emitting diode LED4 will be illuminated indicating operation of the tail and clearance lights. The lack of illumination in any of the tests can be an indication of a missing ground connection.

When the common terminal of switch SW1 is coupled to terminal (3), all switches (except for switch SW1) are in the off position, the truck terminal, and the brake pedal is depressed, light emitting diodes LED2, LED3 and LED5 will be illuminated. When the brake pedal is depressed slightly, light emitting diodes LED2 and LED3 will be illuminated. When the vehicle has a hydraulic brake controller, light emitting diode LED5 will be gradually illuminated as the pressure is increased on the brake pedal. With an electric break controller, the light emitting diode LED5 will be illuminated instantly with increased pressure on the brake pedal.

When the common terminal of switch SW1 is coupled to terminal (3) and the switches SW2-SW6 are in the off position, closing switch SW7 momentarily with the engine running should provide a reading of 13.5 to 14.2 Volts on voltmeter M2.

Although the test apparatus has been described in terms of specific components, it will be clear that related components can be used. For example, the light emitting diodes can be replaced with incandescent lamps without departing from the present invention.

The present invention invention makes use of the fact that only a plurality of plugs or connectors are used to coupled the electrical systems of a main vehicle and a trailer vehicle. For example, the Bargman 7 Way Plug has the components coupled to described with relation to the terminals shown as P1(1)-P1(7) in FIG. 1. In the preferred embodiment, plug P1 is constructed to couple to a Bargman Plug, i.e., plug 28 and plug 29 in FIG. 2. For plugs other than the Bargman Plug, an adapter is placed between plug 28 and plug 29B to accommodate the new terminal assignment and physical structure without requiring alternations in the testing apparatus.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. Apparatus for testing the electrical components of a trailer vehicle and the like, the apparatus comprising:
   a voltmeter having one terminal coupled to a ground potential of said trailer vehicle electrical system;
   a selector switch for selecting one of a plurality of batteries to energize a common terminal of said selector switch;
   a plug for coupling to said trailer vehicle electrical components, said plug containing a plurality of terminals, each of said plurality of plug terminals coupled to a first terminal of a trailer vehicle electrical component, wherein second terminals of said electrical components are coupled to said ground potential;
   an ammeter having a first terminal coupled to said common terminal of said selector switch;
   a plurality of activation switches, each activation switch having a first terminal coupled to a common terminal of said ammeter and having a second terminal coupled to a one of said plug terminals; and
   an illumination device coupled between said common potential and each of said plug terminals, wherein changing a state to an activation switch coupled to said plug terminal applies battery voltage to a coupled electrical component, wherein said voltmeter can determine a status of said applied battery voltage, said illumination device and said ammeter determining when said electrical component having voltage applied thereto is operative, a value provided by said ammeter determining when said electrical component is operating in an expected operational state.

2. The apparatus of claim 1 further comprising a plug for coupling to tractor vehicle electrical components, wherein each illumination device provides test results for a tractor vehicle electrical component related to a trailer vehicle electrical component.

3. The apparatus of claim 2 wherein operation of coupled electrical components in said tractor vehicle can by manipulation of tractor vehicle devices be connected to said coupled tractor vehicle apparatus.

4. The apparatus of claim 1 wherein said selector switch selects a battery from the group consisting of an external battery, a main vehicle battery, and a trailer vehicle battery.

5. The apparatus of claim 1 wherein said plug is a Bargman-type plug, said apparatus including an adaptor unit when a connector cable from said trailer does not include a Bargman-type plug.

6. The apparatus of claim 1 wherein a one of said coupled electrical components includes magnetic brakes, an activation switch coupled to said magnetic brakes including a silicon controlled rectifier for controlably applying current to said magnetic brakes.

7. The method of testing electrical components of a trailer vehicle and tractor vehicle combination, said method comprising the steps of:
   coupling a trailer plug of said tractor vehicle to testing apparatus, said testing apparatus including at least a multiplicity of switches, each switch having an illumination device coupled thereto, said testing apparatus including an ammeter coupled to a common terminal of said switches, said testing apparatus including voltmeter to measure applied voltage;
   selecting an appropriate switch configuration to apply a voltage to a selected terminal of said trailer plug;
   verifying with said voltmeter that said applied voltage is in an acceptable range of values;
   confirming operation of an electrical component coupled to said selected trailer plug by an illumination device coupled to said selected switch and said ammeter; and,
   comparing a value from said ammeter with an expected value, said comparing identifying when components coupled to said selected switch are operating in an acceptable range.

8. The method of claim 7 further comprising the steps of:
   coupling a tractor plug to said testing apparatus;
   manipulating a tractor device which activates an electrical component; and
   verifying operation of said tractor device by examination of said a related illumination device.

9. The method of claim 8 wherein said selecting step includes a step of coupling a meter to said first and said selected terminal selected from the group consisting of an ammeter and a voltmeter.

10. Testing apparatus for testing electrical components of a trailer vehicle and a tractor vehicle, said testing apparatus comprising:

selector means for providing a voltage from one of a plurality of batteries to a common terminal;

a voltmeter for measuring a voltage provided by said selector means;

an ammeter for measuring current through said common terminal;

switch means for electrically coupling said common terminal to a selected plug terminal; and an illumination device coupled to each plug terminal, wherein said illumination device and values from said ammeter and said voltage determines when an electrical component coupled to a selected plug terminal is operating within an expected range.

11. The testing apparatus of claim 10 wherein said selector means selects a battery from a group consisting of a trailer battery, a tractor battery, and an external battery.

12. The testing apparatus of claim 11 wherein said switch means selects trailer electrical components from the group consisting of tail lights, running lights, stop lights, turning signal lights, back up lights and electrical brakes.

13. The testing apparatus of claim 12 wherein said switch means has first configuration, wherein said tail lights are coupled to an ammeter, a current reading of said ammeter determining a number of operational trail lights.

14. The testing apparatus of claim 12 wherein said switch means has second configuration with said magnetic brakes being coupled electrically to said ammeter, a current reading of said ammeter determining a number of operational magnetic brakes.

15. The testing apparatus of claim 12 wherein said selector means couples a battery in said trailer vehicle to a plurality of said illumination devices, activation of a selected illumination device indicting a polarity of said battery in said trailer vehicle.

16. The testing apparatus of claim 10 wherein said plug is coupled to an electrical connector plug of said tractor vehicle, wherein activation of a tractor electrical component by manipulation of a tractor device is verified by illumination of at least one related illumination device.

17. The testing apparatus of claim 16 wherein placing a tractor transmission in a reverse position when an ignition key is in an on position causes a preestablished illumination device to be illuminated.

18. The testing apparatus of claim 16 wherein depressing a brake pedal of said tractor vehicle causes preselected light emitting elements to be activated.

19. The testing apparatus of claim 10 further comprising an adapter providing an electrical interface between said plug and said electrical connector.

20. The testing apparatus of claim 10 wherein said electrical connector cable includes a Bargman-type plug.

* * * * *

UNITED STATES PATENT AND TRADEMARK OFFICE
CERTIFICATE OF CORRECTION

PATENT NO. : 5,086,277
DATED : February 4, 1992
INVENTOR(S) : Robert C. Hammerly It is certified that error appears in the above-identified patent and that said Letters Patent is hereby corrected as shown below:

In Claim 10, line 6, column 7, the following paragraph is inserted:

---a first plug adapted to be electrically coupled to an electrical connector cable from said trailer vehicle, wherein each terminal of said plug is coupled to at least one electrical component of said trailer vehicle when said electrical connector cable is coupled to said first plug;---

In Claim 13, column 8, line 1, the word "trail" has been changed to read ---tail---.

Signed and Sealed this

Eighth Day of June, 1993

Attest:

MICHAEL K. KIRK

*Attesting Officer*    *Acting Commissioner of Patents and Trademarks*